United States Patent
Wang et al.

[11] Patent Number: 6,062,300
[45] Date of Patent: May 16, 2000

[54] EVENLY HEAT-DISSIPATING APPARATUS

[75] Inventors: Chia-Hua Wang, Taipei; Ming-Che Ho, Tachung City; Wen-Shan Chuans, Taipai Shian, all of Taiwan

[73] Assignee: Delta Electronics, Inc., Taoyuan Hsien, Taiwan

[21] Appl. No.: 09/037,326

[22] Filed: Mar. 9, 1998

[51] Int. Cl.[7] ............................... F28F 13/00; H05K 7/20
[52] U.S. Cl. .................... 165/80.2; 165/135; 165/146; 165/185; 361/704
[58] Field of Search ..................... 165/80.2, 135, 165/146, 185; 361/704

[56] References Cited

U.S. PATENT DOCUMENTS

| | | | |
|---|---|---|---|
| 2,905,742 | 9/1959 | Woods | 165/185 X |
| 3,013,186 | 12/1961 | Jones | 165/185 X |
| 3,266,562 | 8/1966 | Navarro | 165/185 X |
| 3,330,333 | 7/1967 | Moss | 165/45 |
| 3,422,886 | 1/1969 | Buller | 165/185 |
| 4,799,543 | 1/1989 | Iversen et al. | 165/135 |
| 5,660,917 | 8/1997 | Fujimori et al. | 165/185 X |

*Primary Examiner*—Allen Flanigan
*Attorney, Agent, or Firm*—Graham & James LLP

[57] ABSTRACT

An apparatus is adapted to be disposed between a heating element and a housing for evenly dissipating heat generated by the heating element. The apparatus includes a first thermal conductor having a first part contacted with the heating element for absorbing the generated heat from the heating element, and having a second part, and a second thermal conductor having a first part with a relatively low thermal conductivity to contact with the first part of the first thermal conductor and a second part with a relatively high thermal conductivity to contact with the second part of the first thermal conductor for transferring the heat from the first thermal conductor to the housing.

16 Claims, 3 Drawing Sheets

EVENLY HEAT-DISSIPATING APPARATUS

FIELD OF THE INVENTION

The present invention is related to a heat-dissipating apparatus, and especially to an apparatus adapted to be disposed between a heating element and a housing for evenly dissipating heat generated by the heating element.

BACKGROUND OF THE INVENTION

A great amount of heat is often generated by the heating element such as transformer and transistor during the operation. If the heat can not be efficiently dissipated, it will cause an increased temperature of the heating element resulting in that the useful life of the heating element will be reduced.

Up to now, there are several ways for dissipating heat. for example, to separate the heating element from the housing or to use a nonconducting plate. However, such ways usually cause an increased temperature of the heating element. Later, another method has been developed, that is, to use a radiator disposed between the heating element and the housing and combined with a copper strip and a shield having a low thermal conductivity. However, it still cannot efficiently dissipate the heat generated by the heating element. Therefore, it is tried by the applicant to solve the above-described problems.

SUMMARY OF THE INVENTION

An object of the present invention is to provide an apparatus adapted to be disposed between a heating element and a housing for evenly dissipating heat generated by the heating element to elongate the useful life of products.

According to the present invention, the apparatus includes a first thermal conductor having a first part contacted with the heating element for absorbing the generated heat from the heating element, and having a second part, and a second thermal conductor having a first part with a relatively low thermal conductivity to contact with the first part of the first thermal conductor and a second part with a relatively high thermal conductivity to contact with the second part of the first thermal conductor for transferring the heat from the first thermal conductor to the housing.

In accordance with one aspect of the present invention, the first thermal conductor is made of materials with a good thermal conductivity. Preferably, the first thermal conductor is an aluminum sheet or a copper sheet.

In accordance with another aspect of the present invention, the first part of the first thermal conductor is contacted with the heating element to obtain a first temperature and the second part of the first thermal conductor has a second temperature lower than the first temperature by thermal conduction after absorbing the generated heat by thermal conduction.

In accordance with another aspect of the present invention, the first part of the second thermal conductor is contacted with the first part of the first thermal conductor to obtain a third temperature lower than the first temperature.

In accordance with another aspect of the present invention, the second part of the second thermal conductor is contacted with the second part of the first thermal conductor to obtain a fourth temperature close to the third temperature. Preferably, the second part of the second thermal conductor is an aluminum sheet or a copper sheet.

Preferably, the first and second parts of the second thermal conductor are two irregular geometric pieces assembled together.

In addition, the first and second parts of the second thermal conductor can be two teethed pieces, both of which are engaged together.

Preferably, the first part of the second thermal conductor is a rectangular piece with an oblique face and the second part of the second thermal conductor is a rectangular piece with a corresponding oblique face to be assembled with the first part of the second thermal conductor.

Preferably, the second thermal conductor is a metal sheet with a serrated hole.

Certainly, the first thermal conductor and the second thermal conductor are integrally formed.

Certainly, the second thermal conductor and the housing are integrally formed.

The present invention may best be understood through the following description with reference to the accompanying drawings, in which:

DETAILED DESCRIPTION OF THE PREFERRED EMBODIMENT

Figure 1:
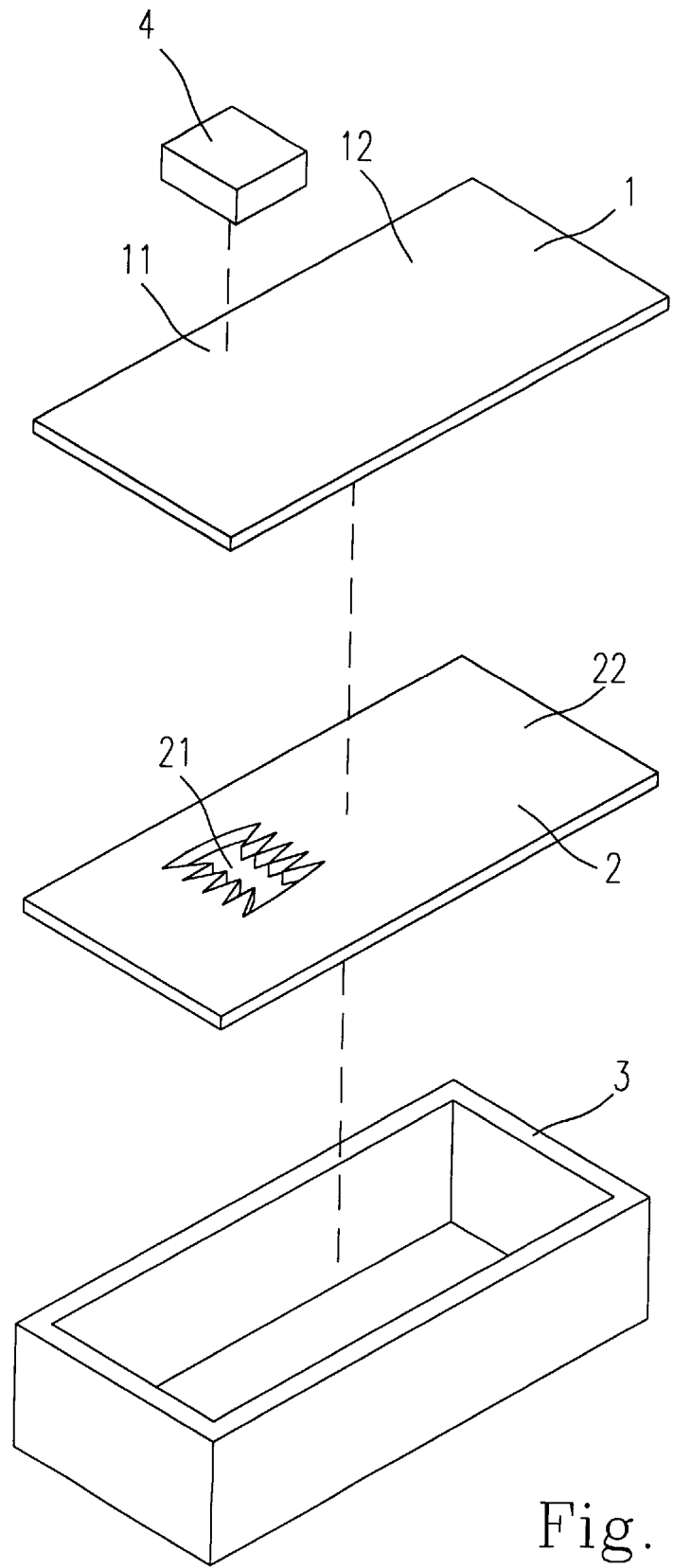
FIG. 1 is a exploded view showing a structure of a preferred embodiment according to the present invention.

Please refer to FIG. 1 showing a structure of a preferred embodiment of the present invention. The apparatus is disposed between a heating element 4 and a housing 3 for evenly dissipating heat generated by the heating element 4. The heat-dissipating apparatus includes a first thermal conductor 1 and a second thermal conductor 2. The first thermal conductor 1 has a first part 11 contacted with the heating element 4 for absorbing the generated heat from the heating element 4. The second thermal conductor 2 has a first part 21 with a relatively low thermal conductivity to contact with the first part 11 of the first thermal conductor 1, and a second part 22 with a relatively high thermal conductivity to contact with the second part 12 of the first thermal conductor 1 for transferring the heat from the first thermal conductor 1 to the housing 3.

The first thermal conductor 1 is preferably made of materials with a good thermal conductivity. Preferably, the first thermal conductor is an aluminum sheet or a copper sheet. The first part 11 of the first thermal conductor 1 is contacted with the heating element 4 to obtain a temperature by thermal conduction after absorbing the generated heat. Thus, there is a temperature gradient generated from the first part 11 of the first thermal conductor 1 (high) to the second part 12 of the first thermal conductor 1 (low) so that the temperature of the second part 12 of the first thermal conductor 1 is lower than that of the first part 11 of the first thermal conductor 1.

The first part 21 of the second thermal conductor 2 is contacted with the first part 11 of the first thermal conductor 2 and the second part 22 of the second thermal conductor 2 is contacted with the second part 12 of the first thermal conductor 1. Because the thermal conductivity of the first part 21 of the second thermal conductor 2 is smaller than that of the second part 22 of the second thermal conductor 2, the rate of transferring the heat from the first part 11 of the first thermal conductor 1 to the first part 21 of the second thermal conductor 2 is slower than that from the second part 12 of the first thermal conductor 1 to the scond part 22 of the second thermal conductor 2. Thus, the temperature of the first part 21 is close to that of the scond part 22. Thereafter, when the heat is transferred to the housing 3, the heat can be evenly distributed on the housing 3.

The second part 22 of the second thermal conductor is preferably a metal plate with a serrated hole as shown in FIG. 1. The metal plate can be an aluminum sheet or a copper sheet. In this example, the heat is transferred to the first part 21 (a serrated hole) of the second thermal conductor 2 by convection, i.e. via air, but the heat is transferred from the second part 12 of the first thermal conductor 1 to the second part 22 of the second thermal conductor 2 by thermal conduction.

Figure 2:
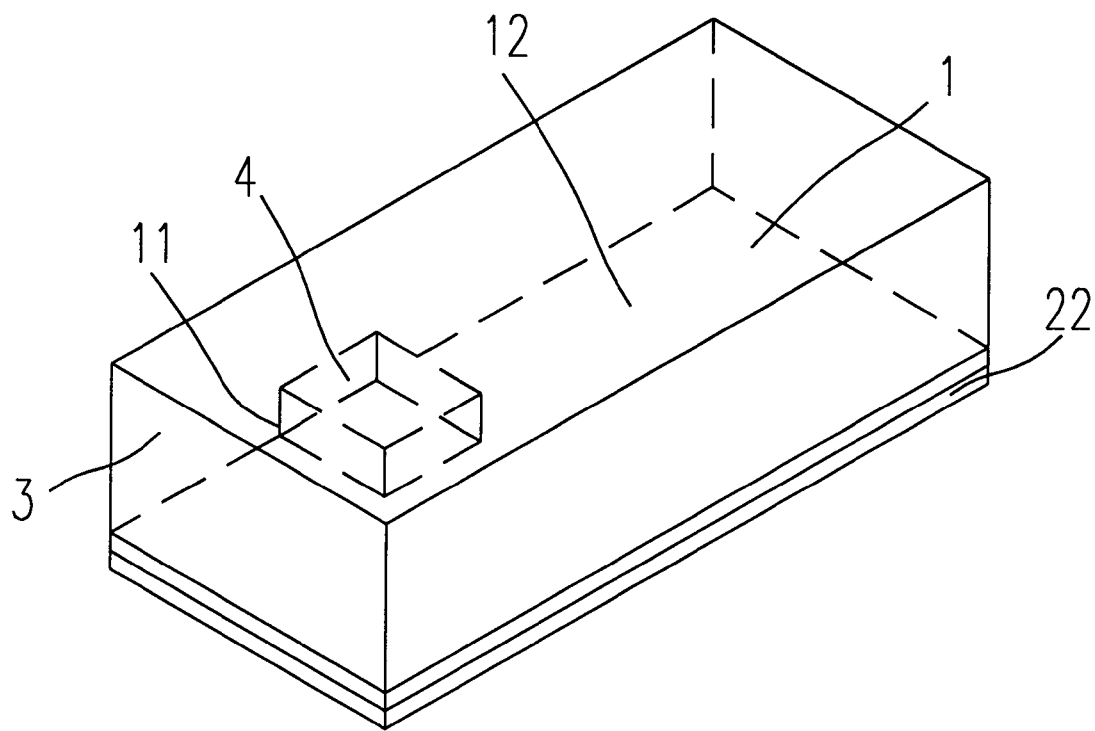
FIG. 2 is a schematic diagram showing a configuration of the preferred embodiment of FIG. 1 according to the present invention.

The heat-dissipating apparatus is assembled with the heating element 4 and the housing 3 as shown in FIG. 2.

Figure 3A:
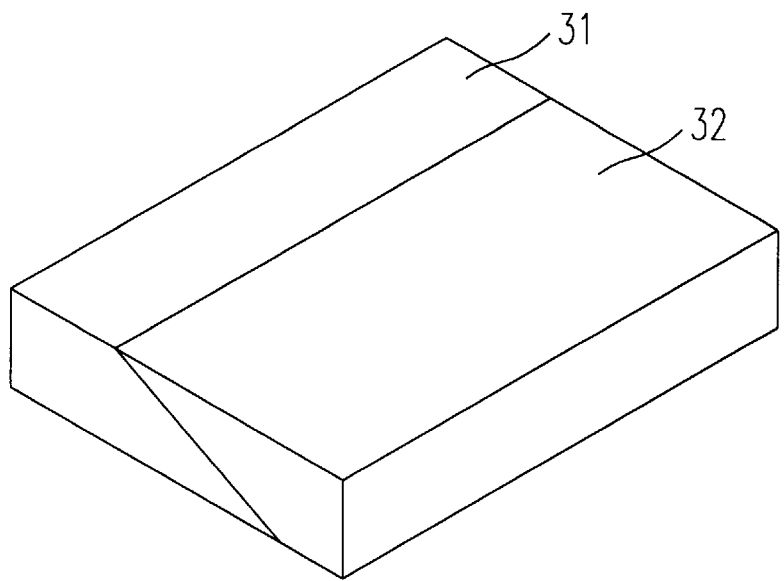
FIG. 3a and 3b are schematic diagrams showing preferred embodiments of the second thermal conductor of the present invention.
Figure 3B:
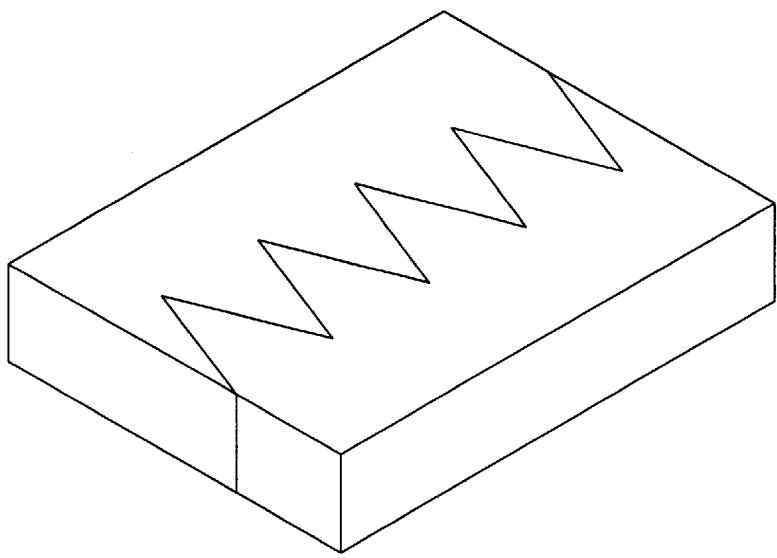

Certainly, the first and second parts of the second thermal conductor can be two irregular geometric pieces assembled together. Preferably, the first part of the second thermal conductor is a rectangular piece with an oblique face and the second part of the second thermal conductor is a rectangular piece with a corresponding oblique face to be assembled with the first part of the second thermal conductor as shown in FIG. 3a. In this example, the heat is transferred to the first part 31 with a low thermal conductivity and the second part 32 with a high thermal conductivity by thermal conduction. In addition, the first and second parts of the second thermal conductor can be two teethed pieces, both of which are engaged together as shown in FIG. 3b. In these two examples, the principle for transferring the generated heat is similar to that of the preceding example.

Certainly, the first thermal conductor and the second thermal conductor can be integrally formed. The second thermal conductor can also be integrally formed with the housing.

In conclusion, the present invention provides an apparatus adapted to be disposed between a heating element and a housing for evenly dissipating heat generated by the heating element. Merely with an easily assembled structure, it can efficiently dissipate the generated heat to prevent the heating element from being destroyed by high temperature and to enlongate the useful life of the heating element.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat dissipating apparatus, comprising:

a heating element having a housing and generating heat;

a first thermal conductor having a first part contacted with said heating element for absorbing said generated heat from said heating element, and having a second part which is not in contact with said heating element; and a second thermal conductor having a first part with a relatively low thermal conductivity to contact with said first part of said first thermal conductor and a second part with a relatively high thermal conductivity to contact with said second part of said first thermal conductor for transferring said heat from said first thermal conductor to said housing.

2. An apparatus according to claim 1 wherein said first thermal conductor is made of material with good thermal conductivity.

3. An apparatus according to claim 2 wherein said first thermal conductor is an aluminum sheet.

4. An apparatus according to claim 2 wherein said first thermal conductor is a copper sheet.

5. An apparatus according to claim 1 wherein said first part of said first thermal conductor is contacted with said heating element to obtain a first temperature and said second part of said first thermal conductor has a second temperature lower than said first temperature after absorbing said generated heat by thermal conduction.

6. An apparatus according to claim 5 wherein said first part of said second thermal conductor is contacted with said first part of said first thermal conductor to obtain a third temperature lower than said first temperature.

7. An apparatus according to claim 6 wherein said second part of said second thermal conductor is contacted with said second part of said first thermal conductor to obtain a fourth temperature close to said third temperature.

8. An apparatus according to claim 1 wherein said second part of said second thermal conductor is an aluminum sheet.

9. An apparatus according to claim 1 wherein said second part of said second thermal conductor is a copper sheet.

10. An apparatus according to claim 1 wherein said first and second parts of said second thermal conductor are two irregular geometric pieces assembled together.

11. An apparatus according to claim 1 wherein said first and second parts of said second thermal conductor are two toothed pieces, both of which are engaged together.

12. An apparatus according to claim 1 wherein said first part of said second thermal conductor is a rectangular piece with an oblique face and said second part of said second thermal conductor is a rectangular piece with a corresponding oblique face to be assembled with said first part of said second thermal conductor.

13. An apparatus according to claim 1 wherein said second thermal conductor is a metal sheet with a serrated hole.

14. An apparatus according to claim 1 wherein said first thermal conductor and said second thermal conductor are integrally formed.

15. An apparatus according to claim 1 wherein said second thermal conductor and said housing are integrally formed.

16. An apparatus adapted to be disposed between a heating element and a housing for evenly dissipating a heat generated by a heating element, comprising:

a first thermal conductor having a first part for absorbing said generated heat from said heating element, and having a second part which is not in contact with said heating element; and a second thermal conductor having a first part with a relatively low thermal conductivity to contact with said first part of said first thermal conductor and a second part with a relatively high thermal conductivity to contact with said second part of said first thermal conductor for transferring said heat from said first thermal conductor to said housing.

* * * * *